United States Patent
Breton et al.

(10) Patent No.: US 8,107,718 B2
(45) Date of Patent: Jan. 31, 2012

(54) METHOD, SYSTEM, AND APPARATUS FOR USE IN LOCATING A STRUCTURE IN AN INTEGRATED CIRCUIT

(75) Inventors: Pierrette M. Breton, Stittsville (CA); Alexei Ioudovski, Nepean (CA)

(73) Assignee: Global Intellectual Strategies, Stittsville, Ontario (CA)

( * ) Notice: Subject to any disclaimer, the term of this patent is extended or adjusted under 35 U.S.C. 154(b) by 1306 days.

(21) Appl. No.: 11/717,723

(22) Filed: Mar. 14, 2007

(65) Prior Publication Data
US 2007/0225854 A1 Sep. 27, 2007

(51) Int. Cl.
*G06K 9/00* (2006.01)
(52) U.S. Cl. ........................................ 382/145
(58) Field of Classification Search ............ 382/313
See application file for complete search history.

(56) References Cited

U.S. PATENT DOCUMENTS

| | | | |
|---|---|---|---|
| 5,940,545 A | 8/1999 | Kash et al. | |
| 6,288,393 B1 | 9/2001 | Phaneuf et al. | |
| 6,496,022 B1 | 12/2002 | Kash et al. | |
| 2003/0146761 A1 | 8/2003 | Pakdaman et al. | |

OTHER PUBLICATIONS

R. Aaron Falk, "Backside Thermal Mapping Using Active Laser Probe", Electronic Device Failure Analysis News, May 2000.
"Dynamic Electroluminescence Imaging (DEI)", MuAnalysis, May 2003.
Sunny Bains, "Two Photon absorption allows imaging of silicon circuits", OE Reports 169, Jan. 1998.

*Primary Examiner* — Brian Werner
*Assistant Examiner* — Elisa Rice
(74) *Attorney, Agent, or Firm* — Global Intellectual Strategies; Pierrette Breton

(57) ABSTRACT

A method, system, and apparatus use in locating a structure in an integrated circuit are provided. Electrical activities are induced in the IC for producing respective unique electromagnetic radiation patterns that collectively contain information on the location of the structure. The electromagnetic radiation patterns are detected, and an area of interest for locating the structure is determined from correlations in the electromagnetic radiation patterns. Once the area of interest is identified a user can more easily locate the structure on the integrated circuit by focusing on the area of interest.

26 Claims, 8 Drawing Sheets

METHOD, SYSTEM, AND APPARATUS FOR USE IN LOCATING A STRUCTURE IN AN INTEGRATED CIRCUIT

CROSS-REFERENCE TO RELATED APPLICATIONS

This application claims the benefit of Canadian Patent Application No. 2,540,238, filed on Mar. 15, 2006.

TECHNICAL FIELD

The invention relates in general to the reverse engineering and analysis of integrated circuits and, in particular, to a method and systems for use in locating a structure in an integrated circuit.

BACKGROUND OF THE INVENTION

Integrated circuits have become important components in most electronic and electromechanical devices. There is considerable revenue generated from the sales of integrated circuits, and it is desirable in the industry to obtain intelligence on an integrated circuit in order to be competitive. As such, the reverse engineering and analysis of integrated circuits have become important aspects of business intelligence.

It is generally desirable to gain competitive intelligence on a simple circuit or only one function within a multifunction chip. An integrated circuit generally includes hundreds of thousands or more components interconnected by a complex network of vias and metal lines. Consequently, it is difficult and time consuming to isolate a circuit or structure of interest used to perform a particular function, or to determine whether the integrated circuit includes the circuit of interest.

Prior art reverse engineering methods are generally directed to methods for determining whether an IC (Integrated Circuit) includes a specific known structure.

Referring to FIG. 1, shown is a flowchart of a conventional method of locating a structure of interest in an integrated circuit. At step 10, the integrated circuit is prepared for analysis. For example, the integrated circuit is decapsulated from its shell. The integrated circuit is then deconstructed (step 12) in a manner well known in the art to expose a first metal layer. The deconstruction of the integrated circuit may be a mechanical process, such as polishing for example or a chemical process such as wet or dry etching. After exposure of a first metal layer, the integrated circuit is mounted on a precision stage and the precision stage is maneuvered to permit images of the first metal layer to be acquired (step 14). If another layer exists (step 16) the integrated circuit is further deconstructed to expose the other layer (step 18) and the step of mounting the integrated circuit on the precision stage and maneuvering the precision stage to acquire the images of that layer (step 14) is repeated. The manner in which the images are acquired depends on the component size of the integrated circuit. If the components are large enough, an optical microscope and an optical imaging system may be used for that purpose. If the components are too small for optical imaging, a scanning electron microscope is normally used to acquire images of the exposed components of each layer.

After images of all the layers are acquired, the images of each layer are mosaiced together combined to form image mosaics (step 20). Many image mosaic methods are known and well understood by those skilled in the art. Once the respective image mosaics are formed, the image mosaics are overlaid and aligned to permit a reverse engineering of the integrated circuit (step 22). After image preparation is complete, a user identifies an area of interest for locating the structure (step 24). This is accomplished on the basis of known information on the configuration and function of the structure. The user then searches the image mosaics for the structure (step 26). For example, the structure may consist of a few dozen components. However, the integrated circuit may have hundreds of thousands of components or more. Such a search may be quite time consuming. If the user locates the structure of interest (step 28) a report is prepared (step 30) and the process ends. If not, the user determines (step 32) whether all search options have been exhausted. If so, the process ends without success. If not, the user identifies another area of interest (step 34) and steps 26, 28, and 30 are performed or steps 26, 28, 32, and 34 are repeated depending on whether all options have been exhausted.

The above described method requires the deconstruction and imaging of an entire integrated circuit to locate a specific structure of interest, this can be very time consuming and expensive.

Another reverse engineering method is disclosed in U.S. Pat. No. 6,496,022 assigned to IBM, which describes a method for locating a known structure by comparing an optical emission pattern of the IC under test with reference patterns. Such an approach to reverse engineering requires that the structure be known and reference data on the structure be available.

Thus, there is a need for a method and system for locating a structure of interest in an integrated circuit, which permits the structure of interest be located more efficiently and for a lower cost. Moreover, there is a need to determine whether the integrated circuit includes a structure of interest when no reference data is available on the structure of the circuit of interest.

SUMMARY OF THE INVENTION

One objective is to provide a method, apparatus, and systems for use in locating a structure in an integrated circuit.

In accordance with a first broad aspect, the invention provides a method for use in locating a structure in an IC. The method involves inducing a plurality of electrical activities in the IC for producing respective unique electromagnetic radiation patterns. The electromagnetic radiation patterns collectively have information on the location of the structure. The method also involves detecting the electromagnetic radiation patterns and determining an area of interest for locating the structure from correlations in the electromagnetic radiation patterns.

In some embodiments of the invention, at least one of the plurality of electrical activities is repeatedly induced to produce a plurality of substantially similar electromagnetic radiation patterns. The area of interest is determined by combining the plurality of substantially similar electromagnetic radiation patterns.

In some embodiments of the invention, for each of the plurality of electrical activities in the IC a unique control parameter is provided for activating one or more structures in the IC. The structures include or excludes the structure to be located.

In some embodiments of the invention, the electromagnetic radiation patterns are functions of respective control parameters used to induce the plurality of electrical activities. The area of interest for locating the structure is determined by correlating the electromagnetic radiation patterns with the control parameters.

In some embodiments of the invention, the electromagnetic radiation patterns are optical electromagnetic radiation patterns.

In some embodiments of the invention, the electromagnetic radiation patterns are infrared electromagnetic radiation patterns.

In some embodiments of the invention, the area of interest is identified by identifying common areas in the electromagnetic radiation patterns.

In some embodiments of the invention, the method involves determining a stimulation plan that uses a sequence of at least two unique control parameters for inducing the plurality of electrical activities in the IC.

In some embodiments of the invention, the stimulation plan is determined based on known operating characteristics of the IC.

In some embodiments of the invention, the IC has a processor, and the method involves loading computer program instructions into the IC for execution by the processor of the IC to induce the plurality of electrical activities in the IC.

In some embodiments of the invention, the method involves: deconstructing the IC; imaging the area of interest to produce images; and verifying the presence of the structure by analyzing the images of the area of interest.

In some embodiments of the invention, the method involves mapping detected areas of electrical activity to a physical layout of the integrated circuit.

In accordance with another broad aspect, the invention provides a system for use in locating a structure in an IC. The system has a stimulation unit for inducing a plurality of electrical activities in the IC for producing respective unique electromagnetic radiation patterns that collectively comprise information on the location of the structure. The system has a detector for detecting the electromagnetic radiation patterns. The system also has an analyzer for determining an area of interest for locating the structure from correlations in the electromagnetic radiation patterns.

In accordance with another broad aspect, the invention provides an apparatus for use in locating a structure in an IC. The apparatus has a stimulation interface for providing instructions to induce a plurality of electrical activities in the IC for producing respective unique electromagnetic radiation patterns that collectively contain information on the location of the structure. The apparatus has a data acquisition interface for receiving information on the electromagnetic radiation patterns. The apparatus also has an analyzer for determining an area of interest for locating the structure from correlations in the electromagnetic radiation patterns.

In accordance with yet another broad aspect, the invention provides an article of manufacture. The article of manufacture has a computer usable medium having computer readable program code means embodied therein for use in locating a structure in an IC. The computer readable code means in the article of manufacture has computer readable code means for providing instructions to induce a plurality of electrical activities in the IC for producing respective unique electromagnetic radiation patterns that collectively comprise information on the location of the structure. The computer readable code means in the article of manufacture has computer readable code means for receiving information on the electromagnetic radiation patterns. The computer readable code means in the article of manufacture also has computer readable code means for determining an area of interest for locating the structure from correlations in the electromagnetic radiation patterns.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

An apparatus, a method, and a system for use in locating a structure of interest in an integrated circuit are provided. Electrical activity is induced in the structure of interest and electromagnetic radiation patterns are emitted by the integrated circuit in response to the electrical activity. A stimulation plan is used to induce a number of electrical activities in the integrated circuit. The stimulation plan includes a sequence of at least two unique control parameters for inducing electrical activity in the integrated circuit. Each electrical activity produces a unique electromagnetic radiation pattern, and the electromagnetic radiation patterns collectively contain information on the location of the structure. The electromagnetic radiation patterns are detected and correlations between the radiation patterns are used to identify one or more areas of interest for locating the structure. The identification of the area or areas of interest permits a focused deconstruction, imaging, and analysis of the integrated circuit to locate the structure, thereby improving efficiency and reducing reverse engineering costs. Furthermore, there is no need for comparison to reference data or model to obtain information on the structure to be located.

Figure 2:
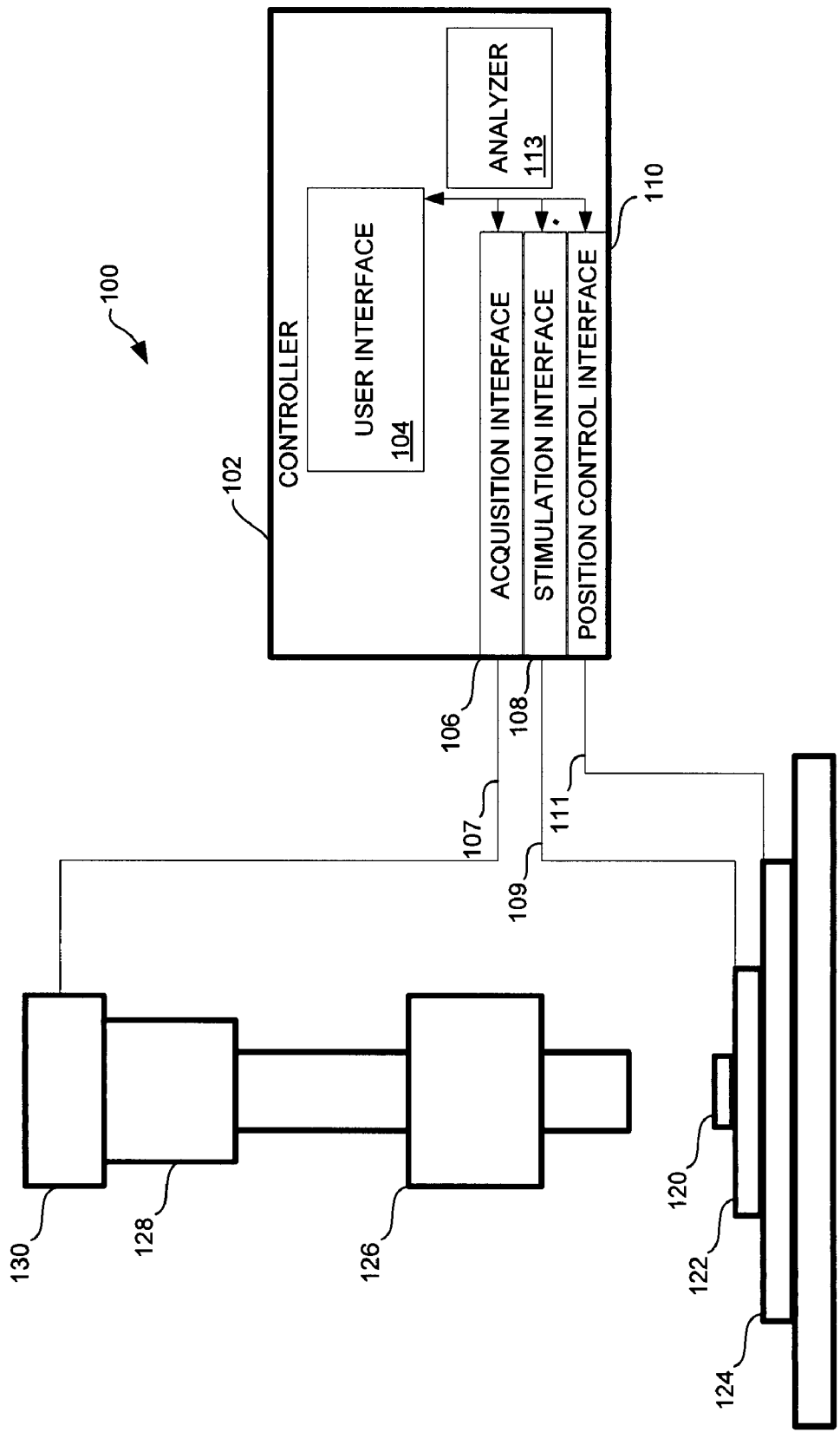
FIG. 2 is a schematic diagram of a system for use in locating a structure of interest in an integrated circuit, in accordance with an embodiment of the invention.

Referring to FIG. 2, shown is a schematic diagram of a system for use in locating a structure of interest in an integrated circuit, in accordance with an embodiment of the invention. The system is generally indicated by 100 and has a controller 102, such as a personal computer or a workstation, for example. The controller 102 has a user interface 104, such as a graphical user interface used to control a data acquisition interface 106; a stimulation interface 108; an position control interface 110, and an analyzer 113. In some implementations, the controller 102 has other functions, which will be described below with reference to FIGS. 3 and 4.

An integrated circuit 120 is mounted on a stimulation platform 122 that is connected to the stimulation interface 108 by way of control lines 109. The stimulation platform 122 is equipped with individually controllable electrical contacts that are connected to input pins of the integrated circuit 120 (not shown in FIG. 2). The stimulation platform 122 is mounted on a precision stage 124 or any other suitable positioning element. In other implementations the stimulation platform 122 is integrally formed on the precision stage 124. The precision stage 124 is connected to the position control interface 110 by way of position control line 111. The system 100 also has a detector having a microscope 126, an amplifier 128, and an image acquisition unit 130. The microscope 126 is an optical microscope, for example. The amplifier 128 is an optical amplifier, for example. The image acquisition unit 130 is a digital camera or any other suitable image acquisition device, and is connected to the controller 102 by way of line 107.

The stimulation interface 108 provides a signal for stimulating input pins of the integrated circuit 120. In some implementations the signal is input into the integrated circuit 120 for inducing electrical activity. In other implementations the signal contains instructions for use by the stimulation platform in inducing electrical activity in the integrated circuit 120. In yet other implementations, the integrated circuit 120 has a processor and computer program instructions are loaded into the integrated circuit for execution by the processor of the IC to induce the electrical activity.

The stage control interface 110 provides instructions to the precision stage 124 for controlling the position of the precision stage 124. In some implementations there is no stage control interface 110.

The microscope 126 receives electromagnetic radiation emitted by the integrated circuit 120 when the integrated circuit 120 is electrically stimulated. The electromagnetic radiation is amplified by the amplifier 128. In some implementations, however, there is no amplifier 128. The electromagnetic radiation is collected by the image acquisition unit 130 to detect electromagnetic radiation patterns. The image acquisition unit 130 sends information on the electromagnetic radiation patterns to the data acquisition interface 106. Image data are stored at the controller 102 and analyzed to identify an area of interest for locating the structure of interest.

The system 100 is used to detect radiation patterns in the optical frequency range. However, other types of radiation patterns can be detected. For example, the electrical activity induced in the integrated circuit 120 creates heat resulting in electromagnetic radiation in the infrared range being emitted from an integrated circuit. However, detecting radiation patterns in the optical frequency range is advantageous in that the shorter wavelengths associated with optical frequencies can provide a better resolution. Furthermore, heat can dissipate in the integrated circuit. As such working in the optical frequency range such effects are avoided. However, in some implementations the effects of heat dissipation are reduced by decapsulating the integrated circuit before any testing.

Figure 11:
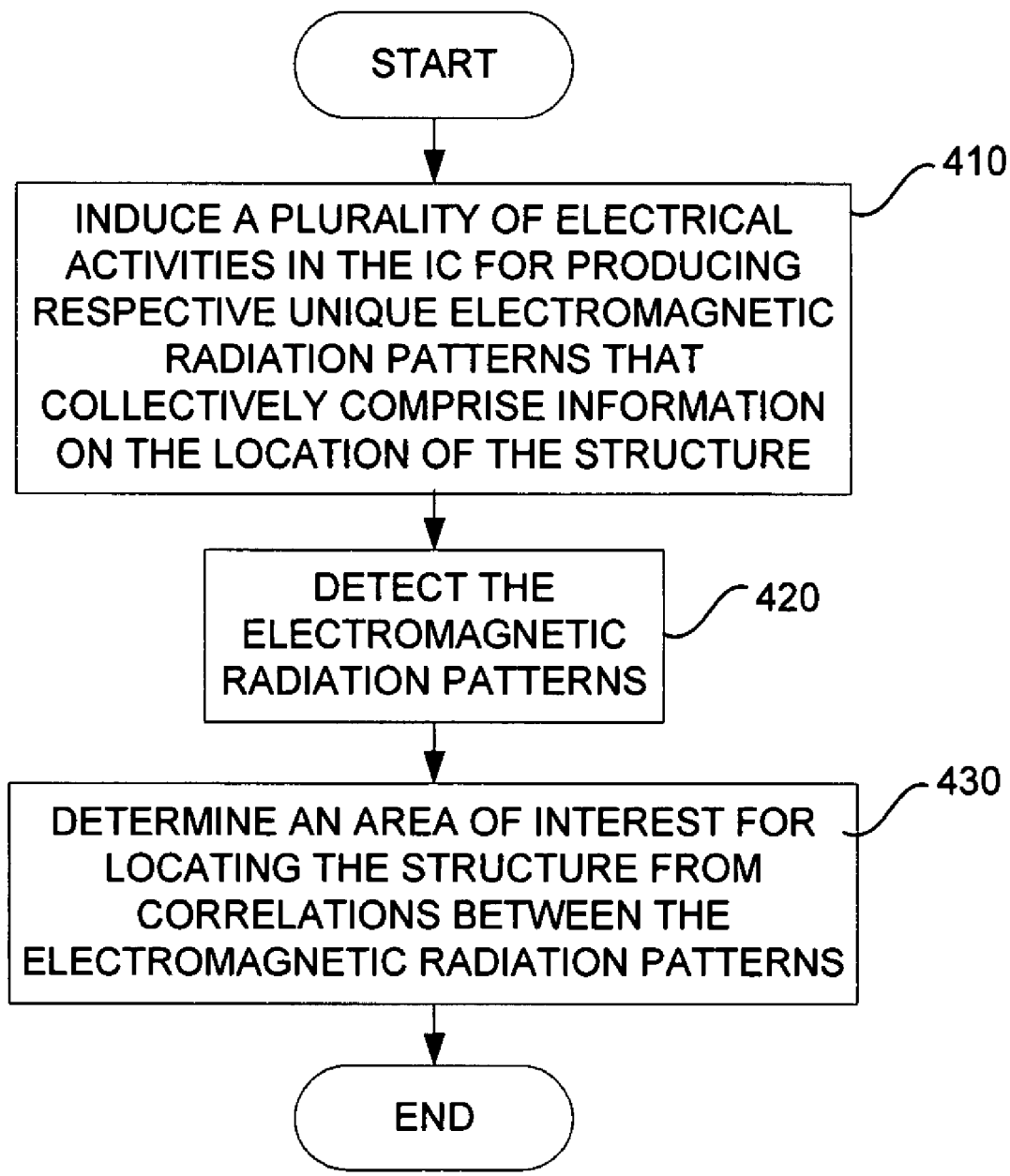
FIG. 11 in a flow chart of a method for use in locating a structure in an integrated circuit, in accordance with another embodiment of the invention.

Referring to FIG. 11, shown is a flow chart of a method for use in locating a structure in an integrated circuit, in accordance with another embodiment of the invention. At step 410, electrical activities are induced in the IC for producing respective unique electromagnetic radiation patterns. The electromagnetic radiation patterns collectively contain information on the location of the structure. For example, in one example implementation each electrical activity is induced according to an integrated circuit stimulation plan directed to induce different electrical activities in the structure of the IC circuit that is to be identified. In some implementations the electrical activities are induced sequentially in time in the integrated circuit. In other implementations the electrical activities are induced on separate identical integrated circuits. In yet other implementations the electrical activities are induced sequentially in time and on separate identical integrated circuits.

At step 420 the electromagnetic radiation patterns are detected. At step 430, an area of interest for locating the structure is determined from correlations in the electromagnetic radiation patterns.

Figure 6:
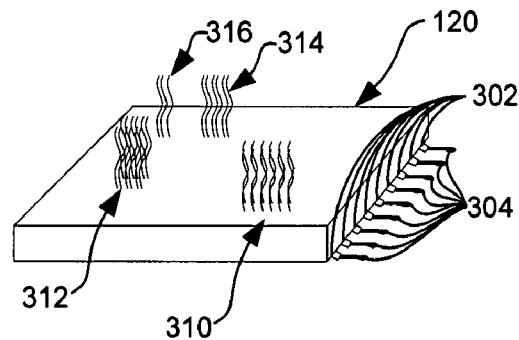
FIG. 6 is a perspective view of an integrated circuit of the system of FIG. 1 being electrically stimulated.
Figure 7:
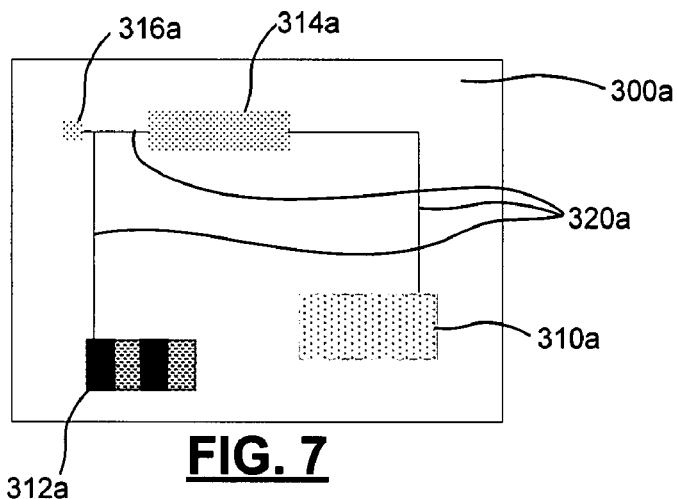
FIG. 7 is a top view of a time exposed image of electromagnetic radiation patterns emitted from the integrated circuit of FIG. 6.

Further details of the method of FIG. 11 will now be described with reference to FIGS. 6 and 7. In FIG. 6, shown is a perspective view of the integrated circuit 120 of the system 100 of FIG. 1 being electrically stimulated. With reference to FIGS. 2 and 6, input pins 302 of the integrated circuit 120 are connected to connectors 304 of the stimulation platform 122 for inducing electrical activity within the integrated circuit 120. In some implementations a stimulation plan is used to produce electrical activity in the structure to be located. In particular, predetermined input conditions are imposed on the input pins 302. However, in most instances an input condition results in not only the structure of interest being electrically active but also results in other components of the integrated circuit 120 being electrically active. As such, in most instances a control parameter imposed on the input pins 302 results a radiation pattern showing electrical activity in more than one structure. For example, in FIG. 6 the electromagnetic radiation 320 is due to the electrical activity of the structure to be located. However, the electromagnetic radiation 310, 314, 316 is emitted due to electrical activity in other structures. In an example implementation, two or more input conditions are imposed on the input pins 302 with each input condition causing electrical activity in the structure to be located and incidentally causing electrical activity in other structures. However, in this example implementation each control parameter causes a unique set of structures to be electrically active with each set containing the structure to be located. As such, each input condition results in a unique radiation pattern, and in the example implementation each radiation pattern includes electromagnetic radiation 312. As such, there is a correlation between the radiation patterns resulting from the different electrical activities in the integrated circuit 120.

In some implementations the correlations are obtained from a time-averaged exposure of the electromagnetic radiation patterns. For example, in FIG. 7 shown is a top view of a time exposed image 300 of electromagnetic radiation patterns emitted from the integrated circuit 120 of FIG. 6. In particular, the image 300 is a combination of two or more unique electromagnetic radiation patterns with each pattern containing electromagnetic radiation 312. The image 300 shows active areas 310a, 312a, 314a, 316a and metal lines 320a. The active area 312a has the highest intensity due to repeated electrical activity in the structure to be located. As such, the image 300 identifies area 312a as an area of interest for locating the structure.

The example implementation makes use of timed exposure to identify correlations. However, it is to be clearly understood that any suitable method of detecting correlation in patterns can be used. The example implementation also uses a stimulation plan in which each predetermined control parameter induces electrical activity in the structure to be located. However, in other implementations a stimulation plan uses control parameters in which the structure to be located is never electrically active. In such implementations, an area of interest is identified by identifying an area or areas without electrical activity. In yet other implementations a combination of both types of stimulation plans are used in one stimulation plan.

Figure 3:
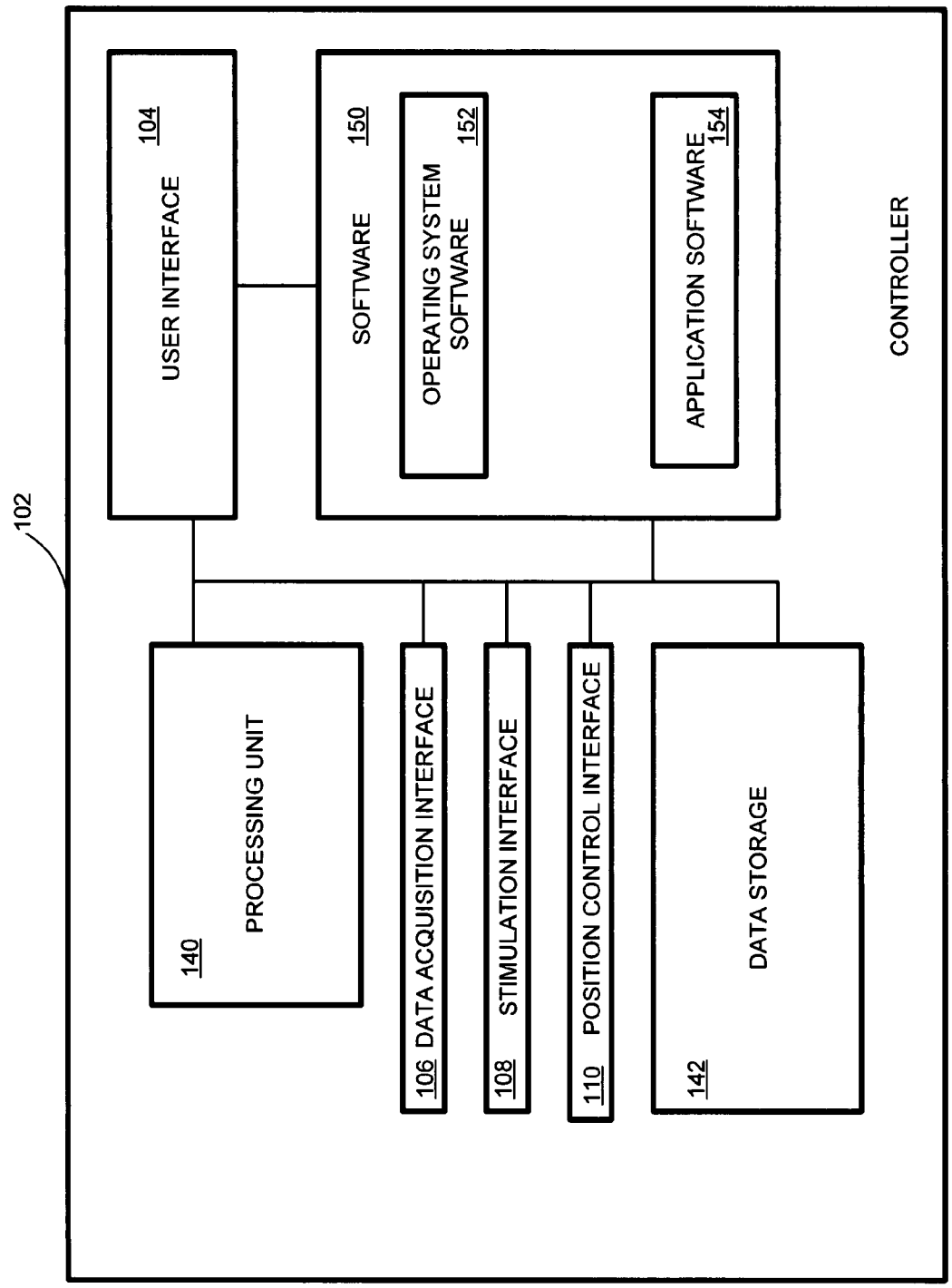
FIG. 3 is a block diagram of a controller of the system of FIG. 2.

Referring to FIG. 3, shown is a block diagram of the system controller 102 of the system 100 shown in FIG. 2. The system controller 110 has a processing unit 140 a user interface 104, operating system software 152, and application software 154, data acquisition interface 106, simulation interface 108, position control interface 110, and data storage 142. The processing unit 140 executes computer executable code for implementing the user interface 104. The processing unit 140 also executes the operating system and application software 150 and stores collected image data and other data in data storage 142. The processing unit 140 also controls hardware/software interfaces of the controller 102 including the data acquisition interface 106, the stimulation interface 108, and the position control interface.

Figure 4:
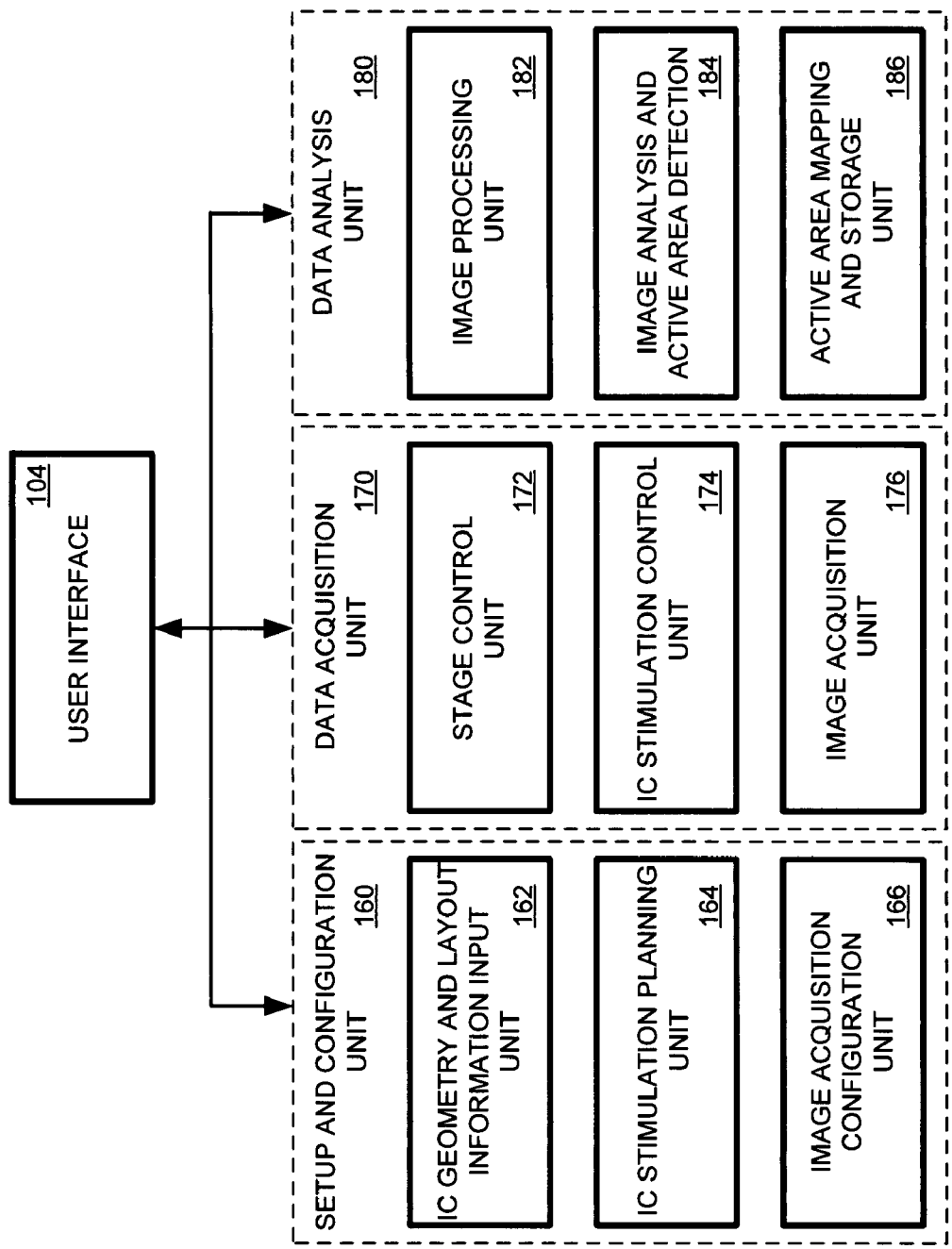
FIG. 4 is a functional block diagram of a portion of the controller of FIG. 3.

Referring to FIG. 4, shown is a functional block diagram of a portion of the controller 102 of FIG. 3. In FIG. 4, the user interface 104 communicates with a setup and configuration unit 160, a data acquisition unit 170, and a data analysis unit 180. The setup and configuration unit 160 has an IC geometry and layout information input unit 162, an IC stimulation planning unit 164, and an image acquisition configuration unit 166. The data acquisition unit 170 has a stage control unit 172, an IC stimulation control unit 174, and an image acquisition unit 176. The data analysis unit 180 has an image processing unit 182, an image analysis and active area detection unit 184, and an active area mapping and storage unit 186. Each one of the setup and configuration unit 160, the IC geometry and layout information input unit 162, the IC stimulation planning unit 164, the image acquisition configuration unit 166, the data acquisition unit 170, the stage control unit 172, the IC stimulation control unit 174, the image acquisition unit 176, the data analysis unit 180, the image processing unit 182, the image analysis and active area detection unit 184, and the active area mapping and storage unit 186 is implemented using any suitable hardware, software, or firmware, or any suitable combination thereof.

The user interface 104 controls and displays data received from the setup and configuration software 160, the data acquisition software 170, and the data analysis software 180. The integrated circuit geometry and layout information input unit 162 is used to input selected geometry and layout information known about the integrated circuit. The geometry and layout information is used by the active area mapping and storage unit 186, as will be explained below in more detail.

The integrated circuit stimulation planning unit 164 permits a user operating the user interface 104 to create a stimulation plan. As discussed above, depending on the structure and functions of the integrated circuit 120 the stimulation plan may require certain integrated circuit "calming" actions to turn off selected functions or to shortcut certain procedures, etc. As such, a stimulation induces a response in the integrated circuit, which facilitates location of the structure of interest by detection and analysis of electromagnetic radiation emitted by the integrated circuit.

Different integrated circuits can be stimulated in different ways. As discussed above, in some implementations an integrated circuit is stimulated by controlling a current source to apply a predetermined voltage directly to input pins of the integrated circuit in a predetermined sequence and for a predetermined duration of time. The voltage is applied according to two or more test conditions which result in unique radiation patterns that can be correlated to identify one or more areas of interest for locating the structure. Some integrated circuits include integrated processors that execute computer program instructions. As discussed above, some embodiments of the invention, program code is used to design a stimulation plan for subjecting the integrated circuit to test conditions for inducing specific electrical activity in the integrated circuit. Alternatively, with reference to of FIG. 2, in some implementations, the controller 102 is programmed with computer program instructions that, when executed, stimulate input pins of the integrated circuit 120 and/or download executable instructions to the integrated circuit 120 to achieve the above-noted purpose.

In some implementations, integrated circuit stimulation planning is accomplished by referring to specifications in datasheets for example and/or programmer manuals written for the integrated circuit to obtain information on how various components and functions of the integrated circuit can be activated. In some instances manuals and datasheets are not available. However, in some instances the integrated circuit is implemented on a printed circuit board, and information on the functionality of the integrated circuit and its pins is obtained from a detailed analysis of the circuit board and/or other devices present of the circuit board. In particular, the other devices will have specific functions and co-operate with the integrated circuit this is used to obtain information on the integrated circuit.

Referring back to FIG. 4, the image acquisition configuration unit 166 is used for configuration and setup of a detector. With reference to FIG. 2, an example detector might includes the image acquisition components such as the microscope 126, the electromagnetic wave amplifier 128, and the image acquisition unit 130. The image acquisition configuration unit 166 provides instructions for configuration and setup to acquire images of electromagnetic radiation patterns emitted by the integrated circuit 120.

With reference to FIGS. 2 and 4, the stage control unit 172 is used to control the precision stage 124 to permit precise positioning of the precision stage 124. The precise positioning of the precision stage 124 provides coordinates used in mapping of active areas. Alternatively, the integrated circuit 120 is mounted on the stimulation platform 122 at a predetermined fixed position.

The integrated circuit stimulation control unit 174 allows the user to implement a stimulation plan obtained using the integration circuit stimulation planning unit 164. The integrated circuit stimulation control unit 174 allows the user to start, stop, interrupt or rerun the stimulation plan, as required, to acquire images for locating the structure of interest in the integrated circuit.

The image acquisition module 176 is used to operate and control a detector to acquire images of the electromagnetic radiation patterns emitted by the integrated circuit 120 when it is stimulated in accordance with the stimulation plan.

The imaging processing unit 182 provides pre-processing functionality on image data from the image acquisition unit 130 and stored by "image acquisition unit" 176 to provide quality improvements to the images. The imaging processing unit 182 produces images of the electromagnetic radiation patterns emitted by the integrated circuit 120. In some implementations, the images are time-resolved in accordance with the stimulation plan, which is designed using the integrated circuit stimulation planning unit 164. A co-ordination between time-resolved images and the stimulation plan is used to identify an area of interest in locating a structure. In some implementations the co-ordination determined using a high speed magneto-optical, electro-optical, or electronic shutter in an optical path of the image acquisition unit 130, or any other suitable device for capturing images in accordance with control parameters in the stimulation plan.

FIG. 4: functions performed by 182, 184 and 186 should be re-considered The image analysis and active area detection unit 184 analyzes the images using information input by a user operating the integrated circuit geometry and layout information input unit 162, in conjunction with image data to select active areas of the images that are potentially associated with the structure of interest. The image analysis and active area detection unit 184 uses segmentation techniques for example to perform the analysis. The analysis performed by the image analysis and active area detection unit 184 takes into account the control parameters imposed by the stimulation plan and which are applied to the integration circuit.

Data output by the image analysis and active area detection unit 184 is passed to the active area mapping and storage unit 186. The active area mapping and storage unit 186 uses information on the integrated circuit geometry and layout to locate areas of interest on a surface of the integrated circuit. In some implementations, the active area mapping and storage module 186 superimposes scaled images received from the image analysis and active area detection module 184 using the integrated circuit geometry and layout information input unit 162 to provide the user with one or more areas of interest for locating the structure.

Figure 5:
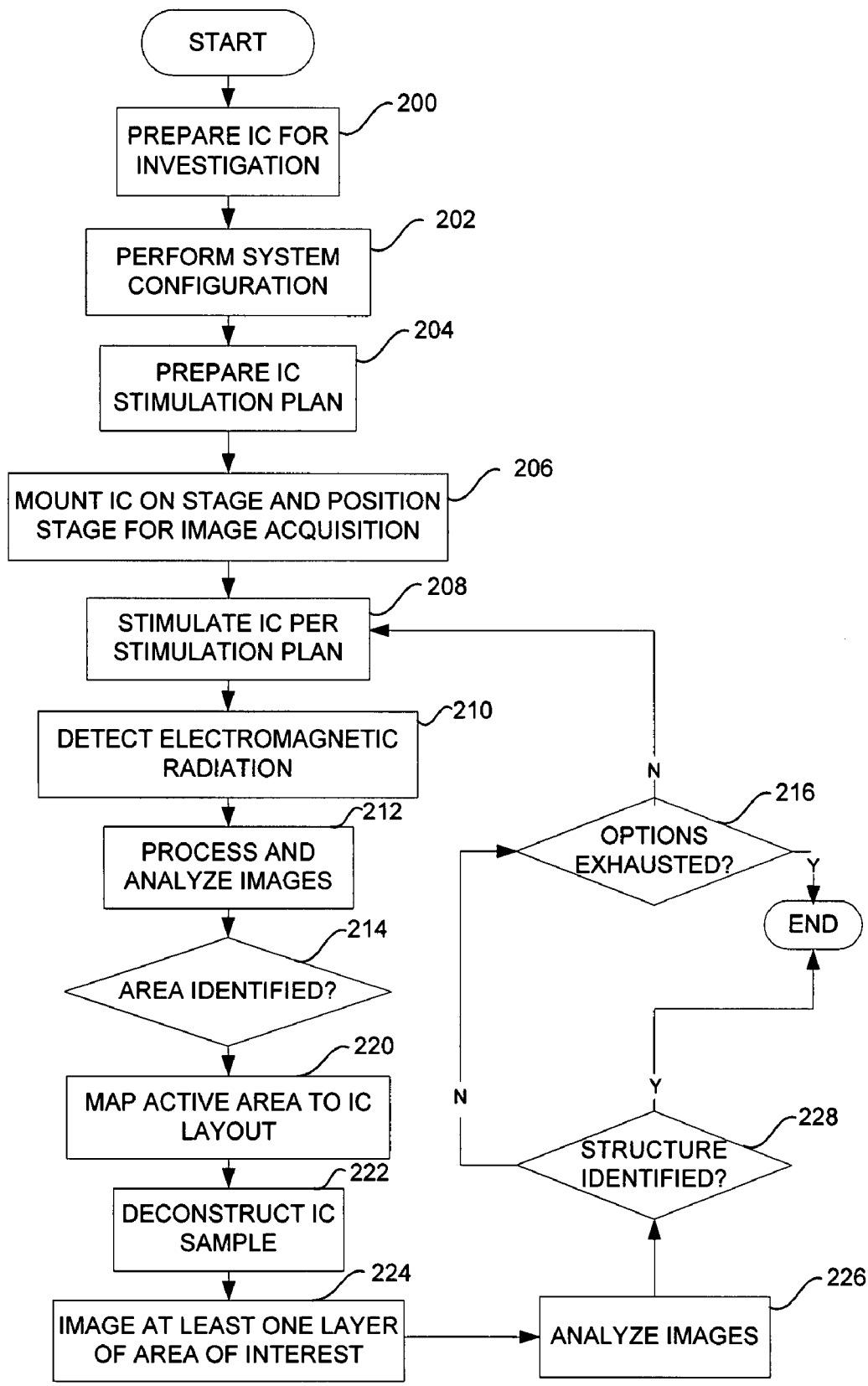
FIG. 5 is a flowchart of a method for use in locating a structure in an integrated circuit, in accordance with another embodiment of the invention.

FIG. 5 is a flowchart of a method for use in locating a structure in an integrated circuit, in accordance with another embodiment of the invention. At step 200, an integrated circuit to be analyzed is prepared for analysis by unpackaging the integrated circuit from its shell. At step 202, a system configuration is performed in which user inputs that include information, such as circuit geometry and layout information for example, are received. This step is implemented using the systems setup and configuration unit 160 of FIG. 4, for example. The information is used to configure image acquisition equipment. At step 204, a stimulation plan is prepared. The stimulation plan is prepared as described above using the integrated circuit stimulation planning unit 164 of FIG. 4, for example.

At step 206, the integrated circuit is mounted on a stimulation platform and positioned on a position element for image acquisition. The positioning is done using the stage control module 172, for example. At step 208, the integrated circuit is stimulated in accordance with the stimulation plan. For example, in some implementations the integrated circuit stimulation control module 174 of FIG. 4 is used to stimulate the integrated circuit. At step 210, electromagnetic radiation patterns emitted by the integrated circuit are detected. For example, in some implementations the detection is controlled by the image acquisition module 176 of FIG. 4. At step 212, the detected electromagnetic radiation patterns are analyzed to look for correlation between the patterns. In some implementations the analysis is performed using the image processing unit 182 and the image analysis and active area detection unit 184 of FIG. 2.

At step 214, a determination of whether one or more areas of interest have been found is determined. In some implementations this step is performed by visual inspection of an image that has combined radiation patterns, while in other implementations the step is automated using image segmentation techniques, for example. In some implementations step 214 is performed using the image analysis and active area detection unit 184 of FIG. 4. If no area of interest has been identified then a determination is made as to whether all investigative options have been exhausted (step 216). If all investigative options have been exhausted, the process ends. If the investigative options have not been exhausted, the stimulation plan is continued (step 210).

At step 214, if one or more areas of interest are identified, the areas are mapped to layout information on the integrated circuit. In some implementations this is done using the integrated circuit geometry and layout information unit 162 of FIG. 4. Information on the areas is used to construct a plan for deconstructing the integrated circuit (step 222). The integrated circuit may have one or more layers of circuitry. Each layer of the integrated circuit is deconstructed and images are acquired for each layer of the area of interest (step 224). The images are then analyzed (step 226) by visual inspection, for example. Visual inspection of circuitry is well known in the art. At step 228, if the structure of interest has been identified the process ends. Otherwise, the process continues with a determination of whether all options have been exhausted (step 216).

Referring back to FIG. 6, a radiation pattern is emitted depending on the input condition being applied to the integrated circuit 120. However, in some cases the intensity of the emitted electromagnetic radiation is low and a particular input must be applied for a predetermined period of time to an exposure time that produces detectable intensity levels. As such, with reference to FIG. 5 at step 216 one option is to continue to apply the stimulation plan and repeat the input conditions to provide a longer exposure. In some cases, a particular control parameter results in a burst of activity in a structure of interest over a limited period of time. In such cases, a repeated application of the control parameter provides a plurality of exposures showing substantially similar radiation patterns and which are used to produce a timed-exposure. For example, if the function of a structure of interest is the decoding of addresses in a memory, in some implementations the simulation plan provides control parameters that result in the structure of interest to decode an address repeatedly by re-applying the same control parameters.

Figure 1:
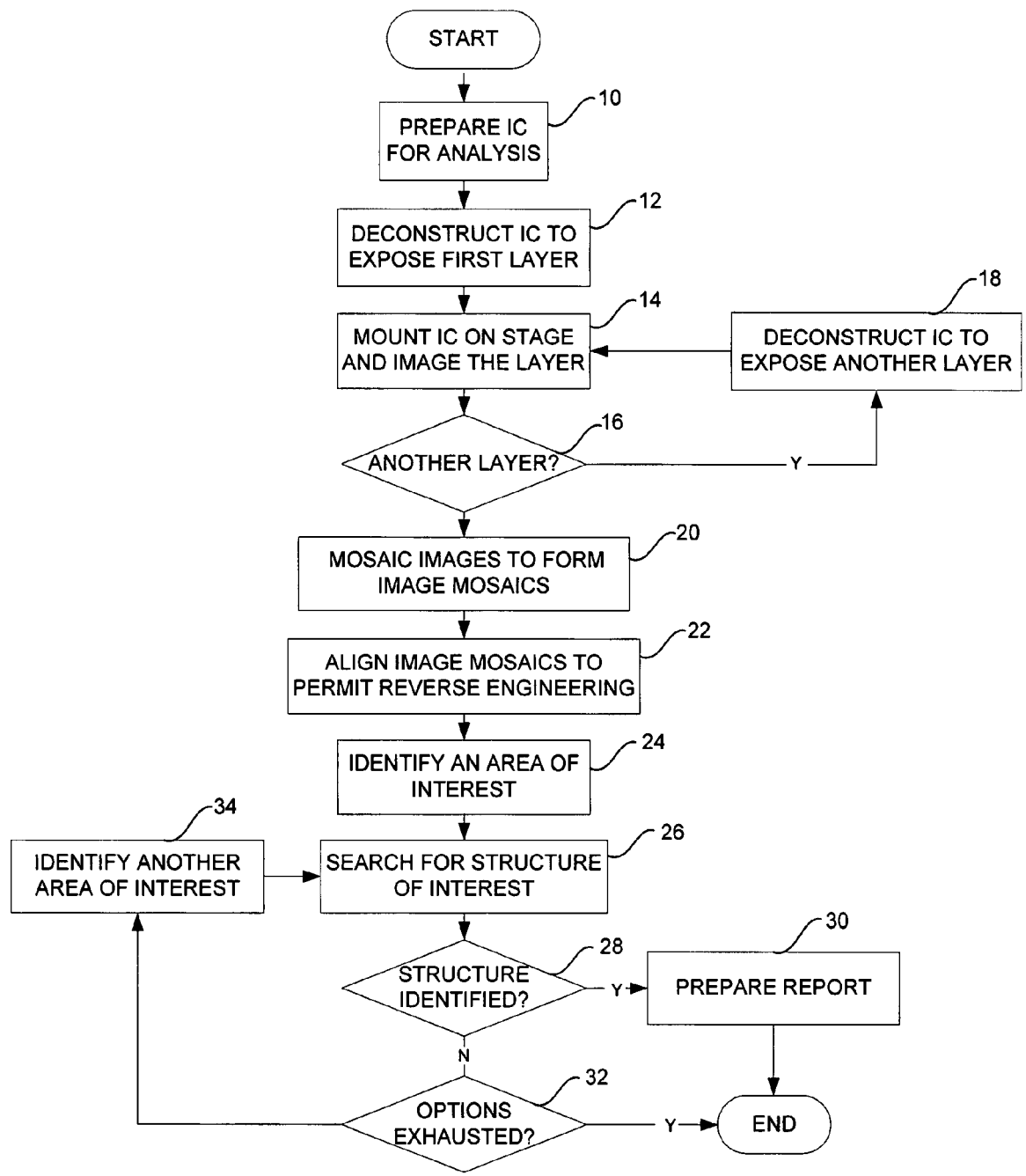
FIG. 1 is a flowchart of a conventional method of locating a structure of interest in an integrated circuit.
Figure 8:
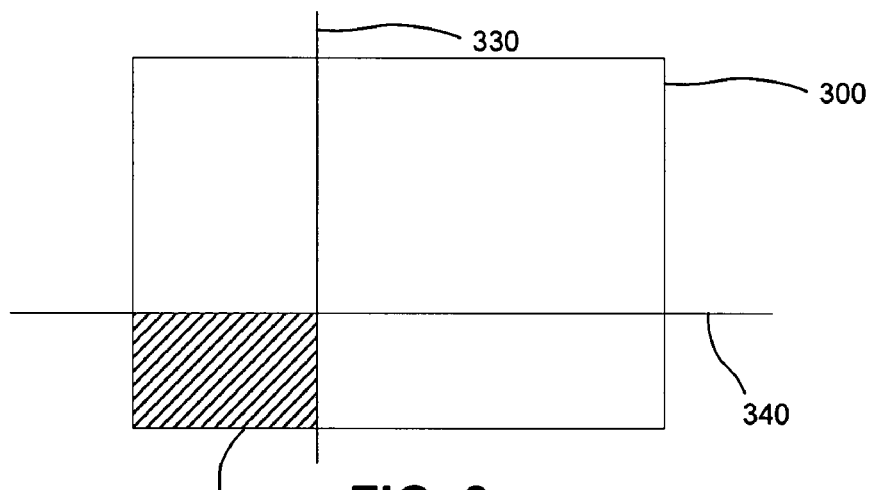
FIG. 8 is a top view of the integrated circuit of FIG. 6 showing how the integrated circuit is sectioned for analysis.
Figure 9:
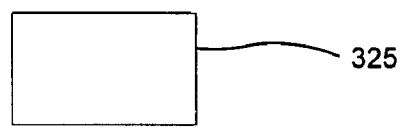
FIG. 9 is a top view of a section of the integrated circuit of FIG. 8 to be deconstructed and imaged for analysis.

With reference to FIGS. 1, 4 and 6, further details of the functionality of the controller 102 of FIG. 1 will now be described in further detail. As discussed above, in FIG. 7 the image 300 is a result of combined radiation patterns, and the image analysis and active area detection unit 184 detects the area 312*a* as an area of interest for locating a structure. With reference to FIGS. 4, 8, and 9, the active area mapping and storage unit 186 outputs a sectioning plan which isolates an area 325 to be investigated, and provides sectioning coordinates 330, 340 which provide a focused area for locating the structure of interest for deconstruction. Images over the area 325 are acquired and mosaiced for obtaining correlations to identify the location of the structure of interest. Thus, a user's workload is greatly reduced thereby reducing the time required and costs to perform the analysis.

As discussed above, in some embodiments, a stimulation plan applies a plurality of unique exercising signals or control parameters to an integrated circuit wherein each control parameter selectively activates a structure of interest and a different structure or structures in the integrated circuit. For example, in an example implementation a plan is designed to apply three stimulation runs. In the first stimulation run a first control parameter activates the structure of interest, which in this example is an address decoder, and a first addressable circuit within the integrated circuit. In the second stimulation run a second control parameter is applied in which the address decoder and a second addressable circuit are activated. Finally, in the third stimulation run a third control parameter is applied wherein the address decoder is shut down while a third addressable circuit is activated.

Figure 10:
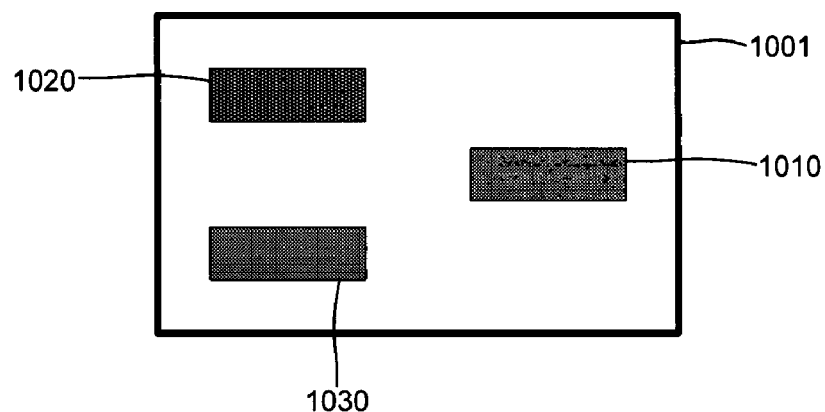
FIG. 10A is an image of an electromagnetic radiation pattern emitted from the integrated circuit of FIG. 6 in response to inducing electrical activity in the circuit.
FIG. 10B is another image of another electromagnetic radiation pattern emitted from the integrated circuit of FIG. 6 in response to inducing different electrical activity in the circuit.
FIG. 10C is another image of yet another electromagnetic radiation pattern emitted from the integrated circuit of FIG. 6 in response to inducing yet other different electrical activity in the circuit.
Figure 10:
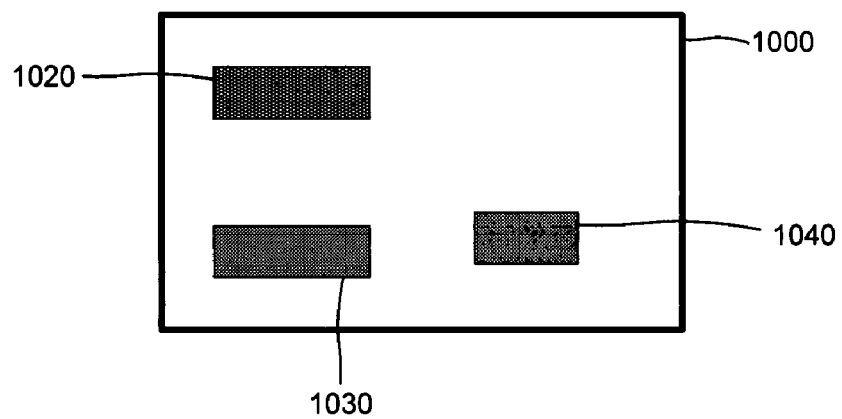
Figure 10:
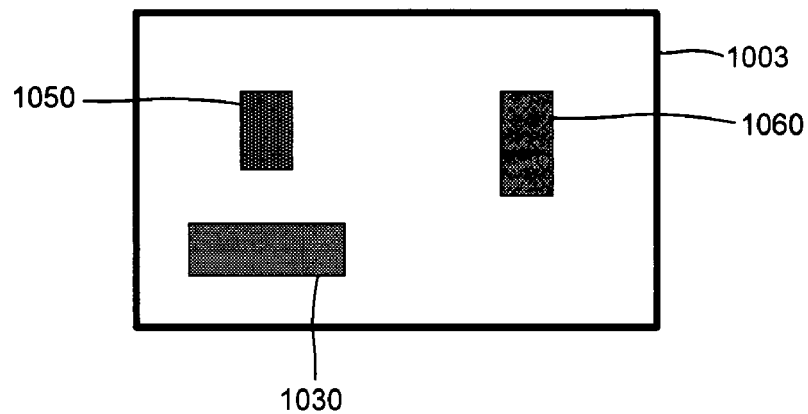

In this example implementation, time-resolved images of the three stimulation runs are used to identify the address decoder. With reference, to FIGS. 10A, 10B, and 10C, the control parameters imposed by the stimulation runs result in images 1001, 1002, 1003, respectively. In particular, the images 1001, 1002, 1003 are results from the first, second, and third stimulation runs, respectively. The image 1001 has areas 1010, 1020, and 1030 showing electrical activity. The image 1002 has areas 1020, 1030, and 1040 showing electrical activity, and the image 1003 has areas 1030, 1050, 1060 also showing electrical activity. In this example stimulation plan the address decoder is active in the first two stimulation runs but not in the third stimulation run, and the area 1020 is shown in images 1001, 1002 but not in image 1003. As such, there are correlations in the area 1020, and this area 1020 is identified as an area of interest in locating the address decoder. In this example implementation the area of interest is identified by identifying correlations between the images 1001, 1002, 1003 and also from correlations between the images 1001, 1002, 1103 and the control parameters used to induce electrical activity in the integrated circuit. Furthermore, in this example implementation each control parameter provides conditions in which three structures are electrically active during a particular stimulation run. In addition, for the first two stimulation runs the structures include the structure to be located and for the last stimulation run there is no electrical activity of the structure to be located. More generally, in each stimulation run there is electrical activity of one or more structures and the electrical activity includes or excludes electrical activity of the structure to be located.

Numerous modifications and variations of the present invention are possible in light of the above teachings. It is therefore to be understood that within the scope of the appended claims, the invention may be practiced otherwise than as specifically described herein.

We claim:

1. A method for use in locating a structure in an IC (Integrated Circuit), the method comprising:
    inducing a plurality of electrical activities in the IC for producing respective unique electromagnetic radiation patterns that collectively comprise information on the location of the structure;
    detecting the electromagnetic radiation patterns; and
    determining an area of interest for locating the structure from correlations in the electromagnetic radiation patterns.

2. A method according to claim 1 wherein at least one of the plurality of electrical activities is repeatedly induced to produce a plurality of substantially similar electromagnetic radiation patterns, the determining an area of interest comprising combining the plurality of substantially similar electromagnetic radiation patterns.

3. A method according to claim 1 wherein for each of the plurality of electrical activities in the IC the inducing comprises providing a unique control parameter for activating at least one structure in the IC, the at least one structure comprising the structure.

4. A method according to claim 1 wherein for each of the plurality of electrical activities in the IC the inducing comprises providing a unique control parameter for activating at least one structure in the IC, the at least one structure excluding the structure.

5. A method according to claim 1 wherein the electromagnetic radiation patterns are functions of respective control parameters used to induce the plurality of electrical activities, the determining an area of interest for locating the structure comprising correlating the electromagnetic radiation patterns with the control parameters.

6. A method according to claim 1 wherein the electromagnetic radiation patterns comprise optical electromagnetic radiation patterns.

7. A method according to claim 1 wherein the electromagnetic radiation patterns comprise infrared electromagnetic radiation patterns.

8. A method according to claim 1 wherein the determining an area of interest for locating the structure from correlations in the electromagnetic radiation patterns comprises identifying common areas in the electromagnetic radiation patterns.

9. A method according to claim 1 wherein the plurality of electrical activities in the IC comprise electrical activity of at least one structure excluding electrical activity of the structure.

10. A method according to claim 8 wherein the plurality of electrical activities in the IC comprise electrical activity of at least one structure including electrical activity of the structure.

11. A method according to claim 1 comprising determining a stimulation plan comprising a sequence of at least two unique control parameters for the inducing a plurality of electrical activities in the IC.

12. A method according to claim 11 wherein the stimulation plan is determined based on known operating characteristics of the IC.

13. A method according to claim 1 wherein the IC comprises a processor, the inducing a plurality of electrical activities in the IC comprising loading computer program instructions into the IC for execution by the processor of the IC.

14. A method according to claim 1 comprising:
    deconstructing the IC;
    imaging the area of interest to produce images; and
    verifying the presence of the structure by analyzing the images of the area of interest.

15. A method according to claim 1 comprising mapping detected areas of electrical activity to a physical layout of the integrated circuit.

16. A system for use in locating a structure in an IC (Integrated Circuit), the system comprising:
    a stimulation unit for inducing a plurality of electrical activities in the IC for producing respective unique electromagnetic radiation patterns that collectively comprise information on the location of the structure;
    a detector for detecting the electromagnetic radiation patterns; and
    an analyzer for determining an area of interest for locating the structure from correlations in the electromagnetic radiation patterns.

17. A system according to claim 16 wherein the electromagnetic radiation patterns are functions of respective control parameters used to induce the plurality of electrical activities, the system comprising means for correlating the electromagnetic radiation patterns with the control parameters.

18. A system according to claim 16 wherein the plurality of electrical activities in the IC comprise electrical activity of at least one structure excluding electrical activity of the structure.

19. A system according to claim 16 wherein the plurality of electrical activities in the IC comprise electrical activity of at least one structure including electrical activity of the structure.

20. A system according to claim 16 comprising a stimulation planning unit for determining a sequence of at least two unique control parameters to obtain a stimulation plan for the inducing a plurality of electrical activities in the IC.

21. An apparatus for use in locating a structure in an IC (Integrated Circuit), the apparatus comprising:
- a stimulation interface for providing instructions to induce a plurality of electrical activities in the IC for producing respective unique electromagnetic radiation patterns that collectively comprise information on the location of the structure;
- a data acquisition interface for receiving information on the electromagnetic radiation patterns; and
- an analyzer for determining an area of interest for locating the structure from correlations in the electromagnetic radiation patterns.

22. An apparatus according to claim 21 wherein the electromagnetic radiation patterns are functions of respective control parameters used to induce the plurality of electrical activities, the apparatus comprising means for correlating the electromagnetic radiation patterns with the control parameters.

23. An apparatus according to claim 21 wherein the plurality of electrical activities in the IC comprise electrical activity of at least one structure excluding electrical activity of the structure.

24. An apparatus according to claim 21 wherein the plurality of electrical activities in the IC comprise electrical activity of at least one structure including electrical activity of the structure.

25. An apparatus according to claim 21 comprising a stimulation planning unit for determining a stimulation plan comprising a sequence of at least two unique control parameters for the inducing a plurality of electrical activities in the IC.

26. An article of manufacture comprising:
- a computer usable medium having computer readable program code means embodied therein for use in locating a structure in an IC (Integrated Circuit), the computer readable code means in said article of manufacture comprising:
- computer readable code means for providing instructions to induce a plurality of electrical activities in the IC for producing respective unique electromagnetic radiation patterns that collectively comprise information on the location of the structure;
- computer readable code means for receiving information on the electromagnetic radiation patterns; and
- computer readable code means for determining an area of interest for locating the structure from correlations in the electromagnetic radiation patterns.

* * * * *